United States Patent
Yieh et al.

(10) Patent No.: US 7,244,658 B2
(45) Date of Patent: Jul. 17, 2007

(54) LOW STRESS STI FILMS AND METHODS

(75) Inventors: Ellie Y Yieh, San Jose, CA (US);
Lung-Tien Han, San Jose, CA (US);
Anchuan Wang, Fremont, CA (US);
Lin Zhang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/252,400

(22) Filed: Oct. 17, 2005

(65) Prior Publication Data

US 2007/0087515 A1   Apr. 19, 2007

(51) Int. Cl.
*H01L 21/76* (2006.01)

(52) U.S. Cl. ............... 438/424; 257/374; 257/E21.545; 257/E21.546

(58) Field of Classification Search ............... 438/294, 438/296, 424, 433, 436, 447, 449, 700, 706, 438/439; 257/374, 524
See application file for complete search history.

(56) References Cited

U.S. PATENT DOCUMENTS 7,049,211 B2 *   5/2006   Karim et al. ............... 438/582
2004/0115898 A1   6/2004   Moghadam et al.
2004/0152341 A1   8/2004   Tan et al.
2004/0157399 A1   8/2004   Lee et al.
2005/0032327 A1   2/2005   Ohnishi et al.
2005/0048801 A1   3/2005   Karim et al.

* cited by examiner

*Primary Examiner*—Quoc Hoang
(74) *Attorney, Agent, or Firm*—Townsend and Townsend and Crew

(57) ABSTRACT

The present invention generally relates to low compressive stress doped silicate glass films for STI applications. By way of non-limited example, the stress-lowering dopant may be a fluorine dopant, a germanium dopant, or a phosphorous dopant. The low compressive stress STI films will generally exhibit a compressive stress of less than 180 MPa, and preferably less than about 170 MPa. In certain embodiment, the STI films of the invention will exhibit a compressive stress less than about 100 MPa. Further, in certain embodiments, the low compressive stress STI films of the invention will comprise between about 0.1 and 25 atomic % of the stress-lowering dopant.

30 Claims, 5 Drawing Sheets

LOW STRESS STI FILMS AND METHODS

BACKGROUND OF THE INVENTION

Semiconductor device geometries have dramatically decreased in size since such devices were first introduced several decades ago. Smaller feature sizes have resulted in the presence of increased aspect ratio gaps for some applications, for example, between adjacent conductive lines or in etched trenches. The aspect ratio of a gap is defined by the ratio of the gap's height or depth to its width. These spaces are difficult to fill using conventional methods. A film's ability to completely fill such gaps is referred to as the film's "gap-filling" ability. Silicon oxide is one type of insulation film that is commonly used to fill the gaps in intermetal dielectric (IMD) applications, premetal dielectric (PMD) applications and shallow trench isolation (STI) applications among others. Such a silicon oxide film is often referred to as a gap-fill film or a gap-fill layer.

Some integrated circuit manufacturers have turned to the use of high density plasma CVD (HDP-CVD) systems to deposit silicon oxide gap-fill layers. HDP-CVD systems form a plasma that is approximately two orders of magnitude or greater than the density of a standard, capacitively-coupled plasma CVD system. Examples of HDP-CVD systems include inductively-coupled plasma systems and electron cyclotron resonance (ECR) plasma systems among others. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gap-fill capabilities as compared to films deposited in a low density plasma CVD system.

Another factor that allows films deposited by HDP-CVD techniques to have improved gap-fill characteristics as compared to films deposited by other CVD techniques is the occurrence of sputtering, promoted by the plasma's high density, simultaneous with film deposition. The sputtering element of HDP deposition slows deposition on certain features, such as the corners of raised surfaces, thereby contributing to the increased gap-fill ability of HDP deposited films. Some HDP-CVD systems introduce argon or a similar heavy gas to further promote the sputtering effect. These HDP-CVD systems typically employ an electrode within the substrate support pedestal that enables the creation of an electric field to bias the plasma toward the substrate. The electric field can be applied throughout the HDP deposition process to generate sputtering and provide better gap-fill characteristics for a given film.

One HDP-CVD process commonly used to deposit a silicon oxide film forms a plasma from a process gas that includes silane ($SiH_4$), molecular oxygen ($O_2$) and argon (Ar). This silicon oxide film has improved gap-fill characteristics as opposed to some silicon oxide films deposited by other non-HDP-CVD plasma techniques and is useful for a variety of applications. Despite the improvement in gap-fill capability provided by HDP-CVD systems and the relatively good gap-fill characteristics of HDP-CVD silicon oxide films in particular, the development of film deposition techniques that enable the deposition of silicon oxide layers having even further improved gap-fill characteristics are desirable. Such improved silicon oxide film depositions are particularly desirable in light of the aggressive gap-fill challenges presented by integrated circuit designs employing minimum feature sizes of 0.18 microns and less.

One known way to improve the gap-fill capability of silicon oxide films is to add a fluorine-containing source gas to the process gas. Fluorine atoms are known to etch silicon oxide and it is known that the inclusion of fluorine into a silicon oxide deposition process results in etching simultaneous with deposition which in turn can improve the deposited film's gap-fill capability. The incorporation of fluorine into a silicon oxide film also has a primary benefit of reducing the dielectric constant of the deposited film. A silicon oxide film (also referred to as a silicate glass layer) that includes fluorine is often referred to in the industry as a fluorine-doped silicon oxide film or as a fluorosilicate glass (FSG) layer.

Because of stability and other issues, FSG films are generally not used for PMD or STI applications and have been primarily limited to intermetal dielectric (IMD) applications.

Semiconductor manufacturers are often particularly hesitant to include fluorine in PMD and STI layers because such layers are likely to be subject to relatively high temperatures (e.g., above 450° C. and often above 700° C.) either during deposition of the layer or during a process step that is subsequent to deposition of the layer. At such high temperatures, fluorine is more likely to outgas from FSG layers and migrate into an adjacent layer. Thus, many semiconductor manufacturers prefer that PMD or STI layers have less than 1.0 atomic percent (at. %) fluorine. IMM layers, on the other hand, are typically deposited after the first metal layer and thus never subject temperatures above 450° C.

Typically, undoped silicate glass (USG) or other silicon oxide family members including BPSG (borophosphosilicate glass) and PSG (phosphosilicate glass) are used for PMD layers, and USG is used for STI applications. However, USG exhibits high compressive stress, e.g., greater than 220 MPa. For many applications, a lower compressive stress STI film with adequate gap fill performance is desirable.

In view of the above, additional methods of depositing low compressive stress STI silicon oxide films having sufficient gap-fill capabilities are desirable.

BRIEF SUMMARY OF THE INVENTION

The present invention generally relates to low compressive stress doped silicate glass films for STI applications. By way of non-limited example, the stress-lowering dopant may be a fluorine dopant, a germanium dopant, or a phosphorous dopant. The low compressive stress STI films will generally exhibit a compressive stress of less than 180 MPa, and preferably less than about 170 MPa. In certain embodiment, the STI films of the invention will exhibit a compressive stress less than about 100 MPa. Further, in certain embodiments, the low compressive stress STI films of the invention will comprise between about 0.1 and 25 atomic % of the stress-lowering dopant.

In one aspect, the invention provides a method of depositing a low compressive stress, shallow trench isolation (STI) film with good gap fill characteristics on a substrate having a gap between adjacent raised surfaces. The method generally comprises: (a) positioning the substrate in a deposition chamber; (b) providing a gas mixture to the deposition chamber in one or more steps; (c) reacting the gas mixture in the presence of an electric field to generate a plasma having an ion density of at least $10^{11}$ ions/cm$^3$; (d) and exposing the substrate to the plasma under conditions sufficient to thereby deposit a low compressive stress STI film within the gap of the substrate. In accordance with such a method, the gas mixture preferably comprises a silicon source, a stress-lowering dopant source, a fluent gas source, and a oxidizer. Further, the deposited STI film preferably exhibits a compressive stress of less than about 170 MPa.

In another aspect of the invention, a method of lowering the compressing stress of a shallow trench isolation (STI) film is provided. The method generally comprises: (a) providing a gas mixture comprising a silicon source, a stress-lowering dopant source, a fluent gas source, and an oxidizer to a high density plasma chemical vapor deposition (HDP-CVD) chamber for deposition of a low compressive stress STI film on a substrate via high density plasma chemical vapor deposition (HDP-CVD); and (b) generating a plasma within said HDP-CVD chamber to thereby deposit said low compressive stress STI film on said substrate. In accordance with such methods, the substrate is heated to a temperature of at least 450° C., preferably 500° C., during the deposition. Further, the gas mixture preferably comprises sufficient stress-lowering dopant source and the STI film is deposited under conditions sufficient to result in the deposit of a STI film that exhibits a compressive stress of less than about 170 MPa.

These and other embodiments of the present invention along with many of its advantages and features are described in more detail in conjunction with the text below and attached figures.

DETAILED DESCRIPTION OF THE INVENTION

I. Introduction

The present invention generally relates to low compressive stress doped silicate glass for STI application. By way of non-limiting example, the compressive stress lowering dopant may be fluorine, germanium, or phosphorous.

In one embodiment, fluorine may be incorporated into silicate glass to result in low stress STI films (e.g., an in-situ etch assisted (ISEA) deposited film, ~180 MPa). Previous FSG processes utilizing fluorine typically result in an MM film having a compressive stress of approximately <80 MPa. However, in accordance with the present invention, it has been discovered that higher fluorine levels may be incorporated into STI films to thereby further reduce the compressive stress of the resultant film to levels below 180 MPa (e.g., below about 170 MPa, 150 MPa, 100 MPa, 90 MPa, 70 MPa, etc.) with good gap fill capabilities. The present invention combines the advantages of ISEA deposition and FSG films to obtain higher fluorine levels at higher temperatures to achieve good gap fill and low compressive stress in STI applications.

In another embodiment, germanium doped silicate glass (GeSG) with low compressive stress for STI applications is provided. In accordance with the present invention, the germanium content in the final STI film may be controlled to attain the desired STI film compressive stress with good gap fill capabilities.

In yet another embodiment, phosphorous doped silicate glass (PSG) with low compressive stress for STI applications is provided. Previous use of PSG has generally been limited to PMD applications. However, in accordance with the present invention, it has been discovered that the higher temperatures of STI applications can result in the incorporation of sufficient amounts of phosphorous dopant to attain low compressive stress STI films with good gap fill capabilities. In certain embodiments, particularly for high phosphorous atomic % (at. %) in the final STI film (e.g., greater than about 10 at. %), a reflow process may be used to attain better gap fill and film stability if desired.

Figure 1A:
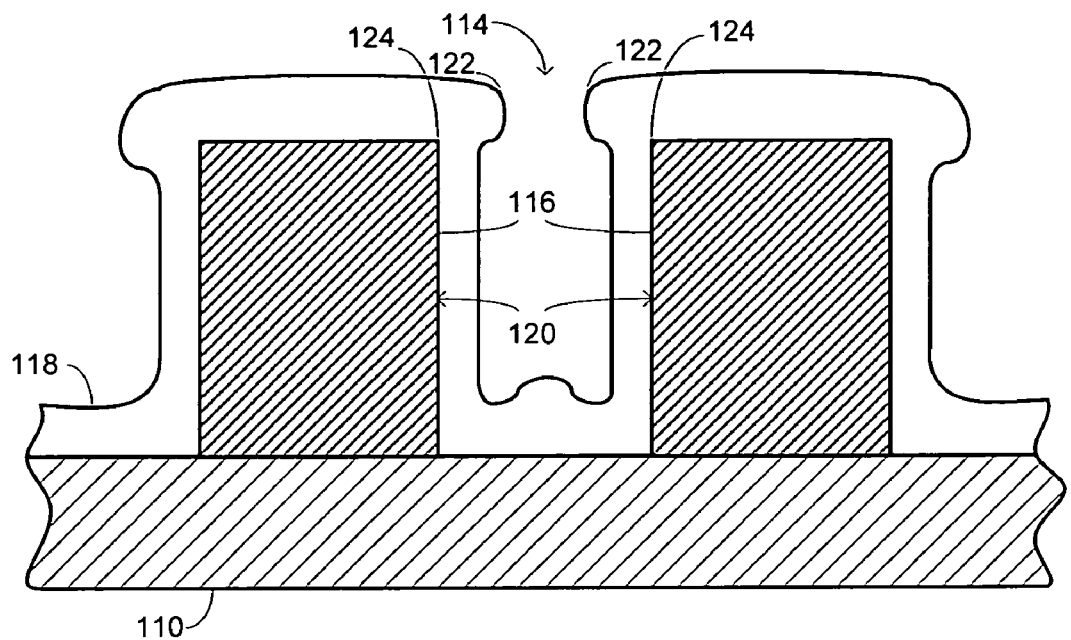
FIGS. 1A and 1B are schematic cross-sectional drawings illustrating the formation of a void during a gap-fill process.
Figure 1B:
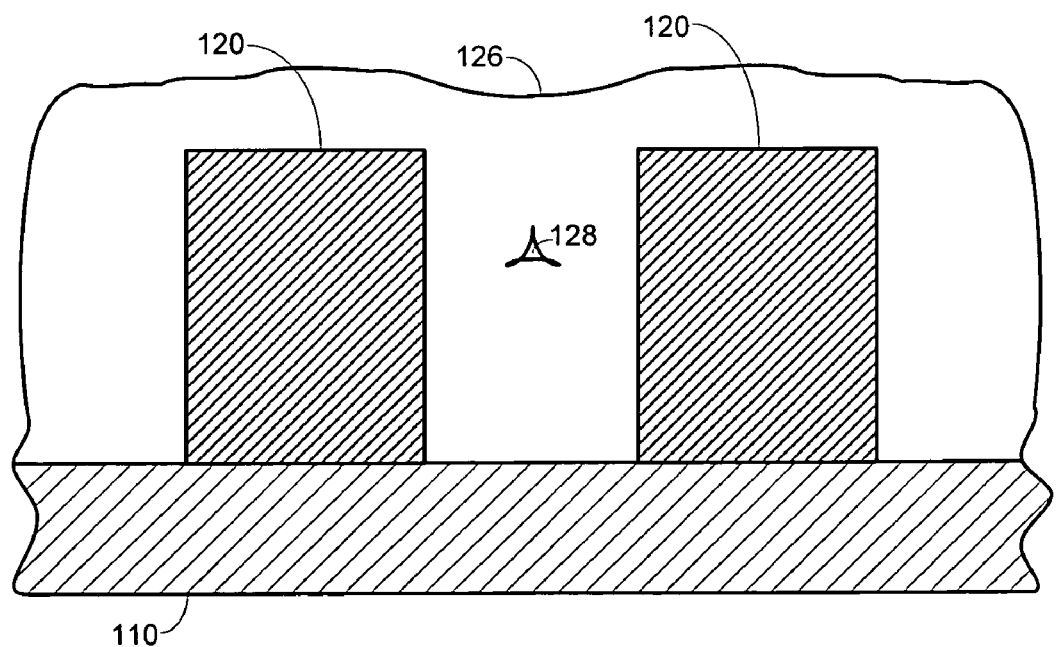

The gap-fill problem addressed by embodiments of the invention in conjunction with the low compressive stress is illustrated schematically with the cross-sectional views shown in FIGS. 1A and 1B. FIG. 1A shows a vertical cross section of a substrate 110, such as may be provided with a semiconductor wafer, having a layer of features 120. Adjacent features define gaps or isolation trenches 114 that are to be filled with STI film 118, with the sidewalls 116 of the isolation trenches being defined by the surfaces of the features 120. Features 120 may be etched in the surface of substrate 110, e.g., via anisotropic etching to obtain desired depths and geometries. As the deposition proceeds, STI film 118 accumulates on the surfaces of the features 120, as well as on the substrate 110 and forms overhangs 122 at the corners 124 of the features 120. As deposition of the STI film 118 continues, the overhangs 122 typically grow faster than the trench 114 in a characteristic bread-loafing fashion. Eventually, the overhangs 122 grow together to form the dielectric layer 126 shown in FIG. 1B, preventing deposition into an interior void 128.

CVD deposition of USG films typically proceeds by flowing a process gas into a process chamber with the process gas comprising a silicon source and an oxidizing gas reactant. The silicon source typically comprises a silane compound such as $SiH_4$ and the oxidizing gas reactant typically comprises $O_2$ Sometimes an inert gas such as Ar, He, or $H_2$ may also be included as a fluent gas. Improved gap-fill characteristics have generally been achieved using HDP-CVD because the high density of ionic species in the plasma during an HDP-CVD process causes there to be sputtering of a film even while it is being deposited. This combination of simultaneous sputtering and deposition tends to keep the gap open during deposition, although there remain limits to gap-fill capability with such processes.

In accordance with the present invention, an STI film with low compressive stress may be deposited into trenches 114 without the formation of interior void 128, thereby attaining gap-fill.

As will be recognized by those skilled in the art, to further improve gap-fill and adhesion of the STI film, various pad oxides, nitride pads, and liner oxides may be incorporated into the substrate/film stack at predetermined locations and densified, as known in the art (not shown). For instance, pad oxides and nitride pads may be incorporated on the surface of the substrate if desired, and liner oxides may be formed on the wall of the isolation trench if desired.

II. Exemplary Deposition Methods

Figure 2:
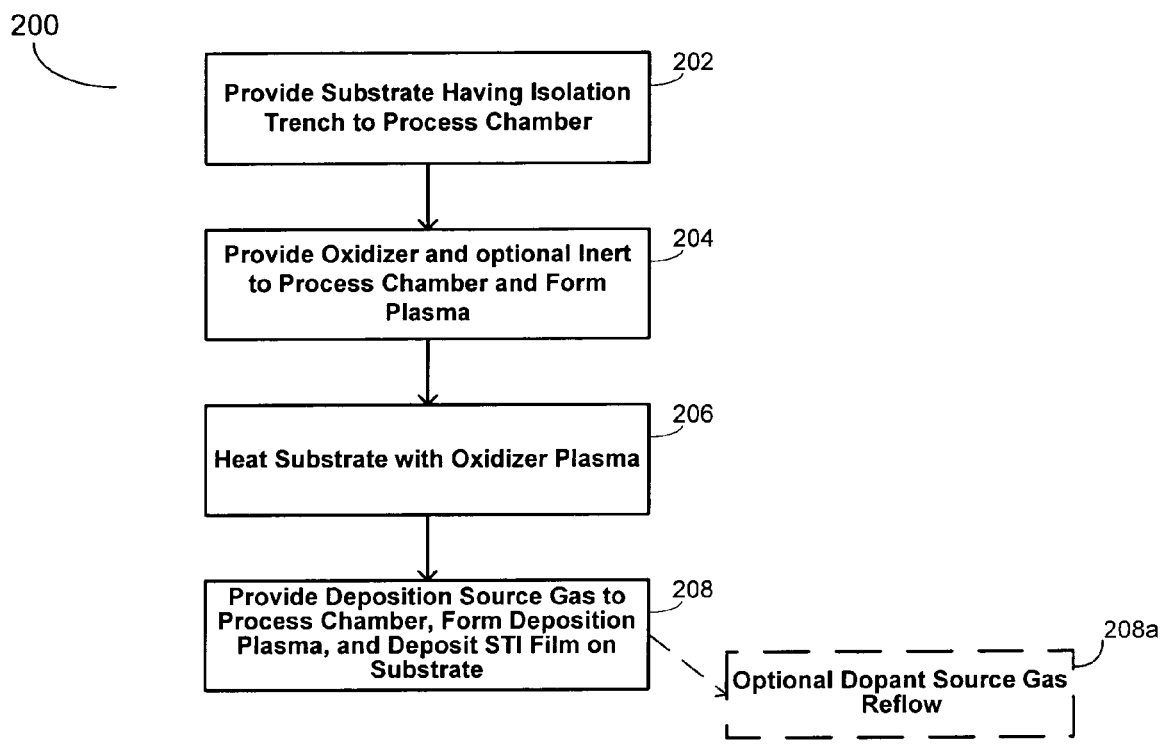
FIG. 2 is a flow diagram illustrating a method for depositing a low compressive stress STI film or layer to fill a gap in embodiments of the invention.
Figure 3:
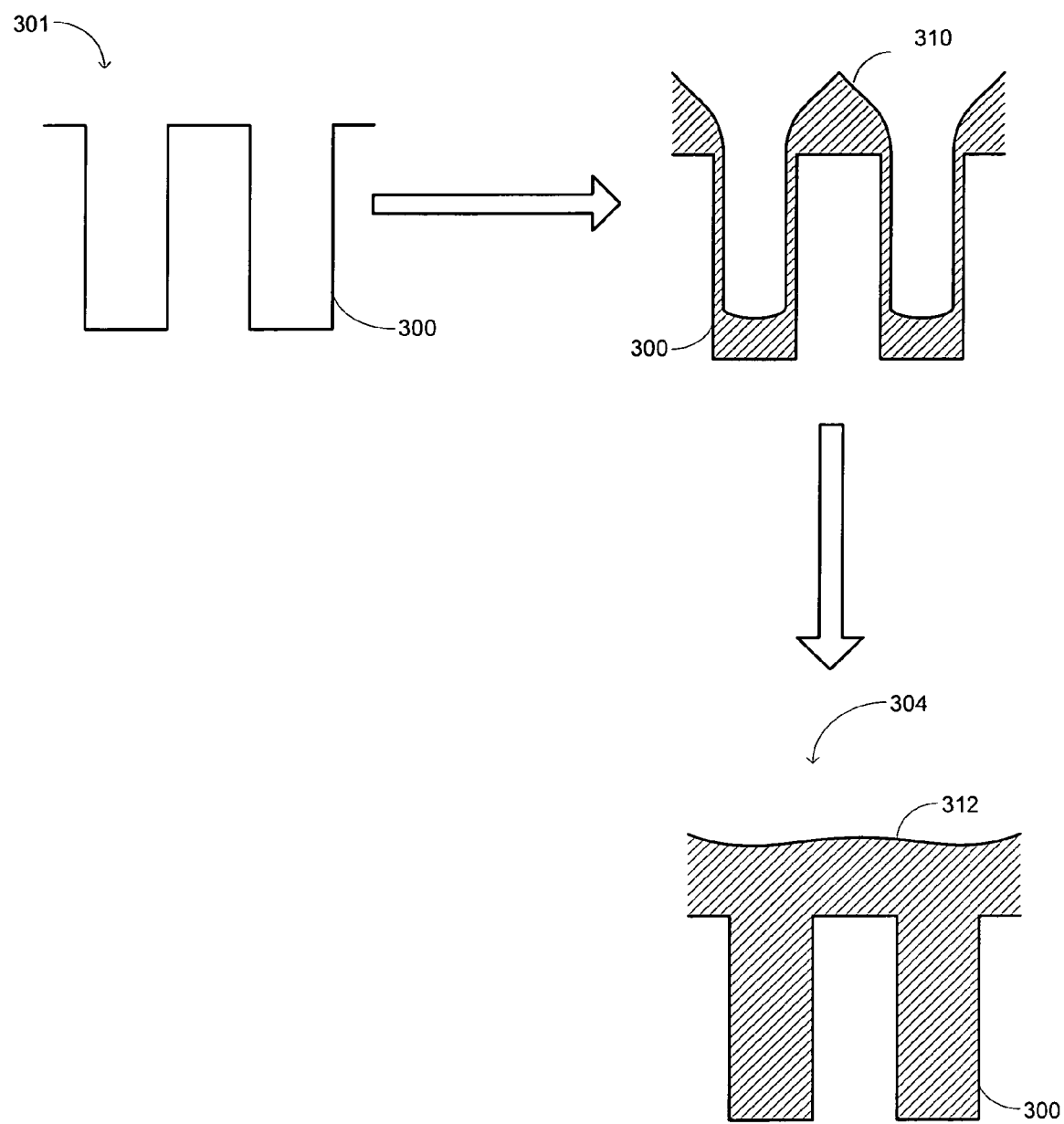
FIG. 3 provides schematic cross-sectional drawings illustrating how a high-aspect-ratio feature may be filled using a process according to an embodiment of the invention.
Figure 4A:
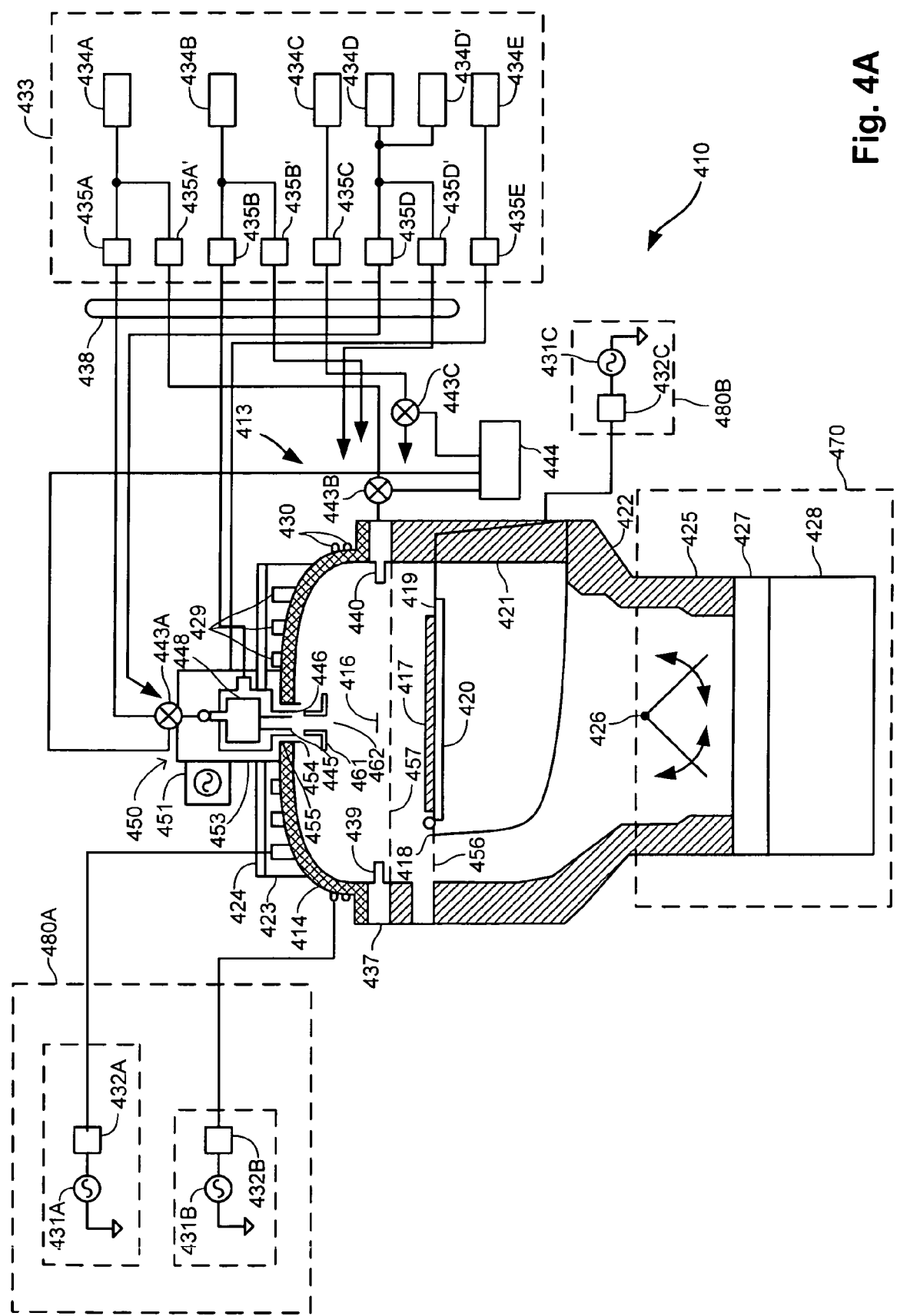
FIG. 4A is a simplified diagram of one embodiment of a high-density-plasma chemical-vapor-deposition system with which methods of the invention may be implemented.
Figure 4B:
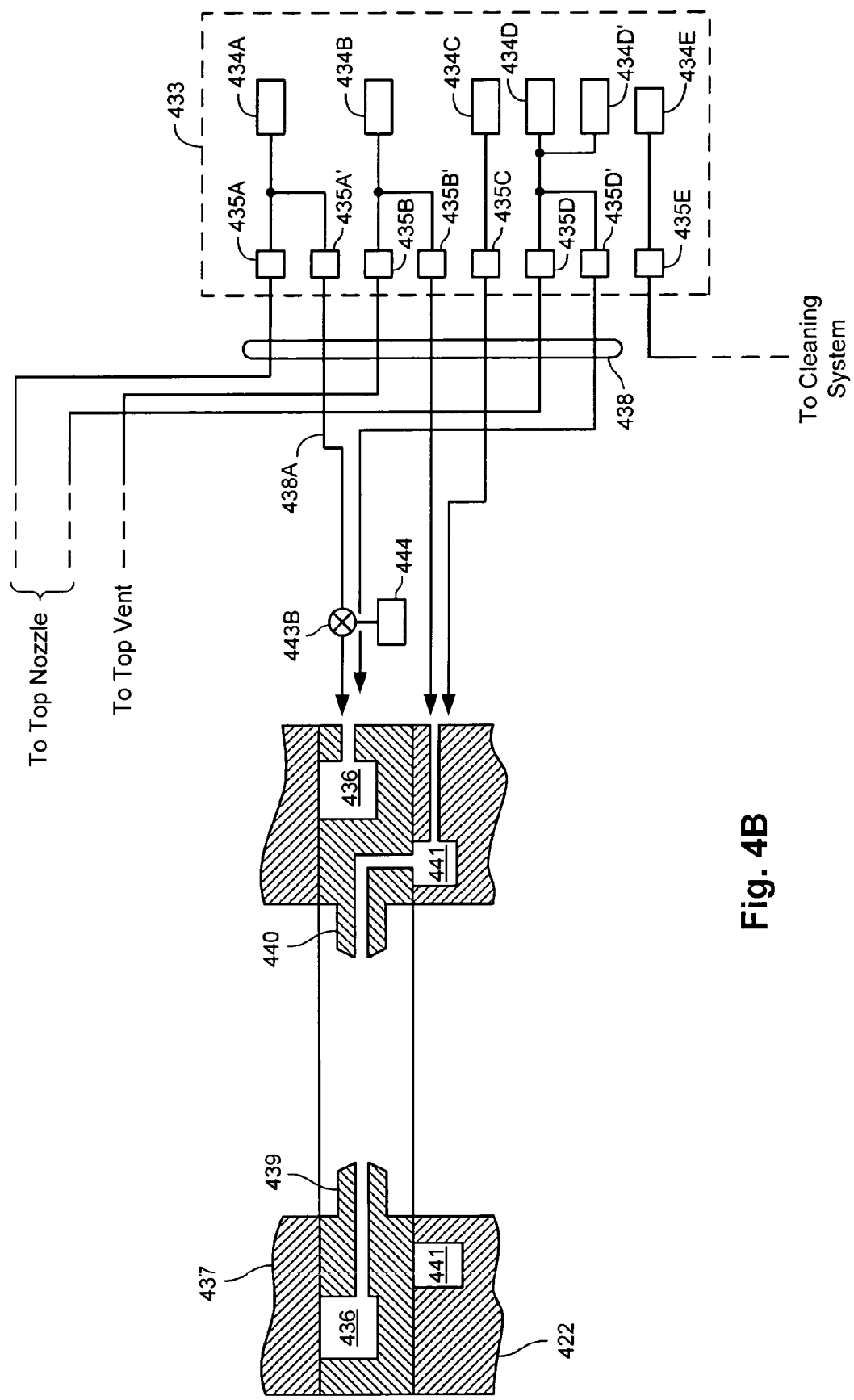
FIG. 4B is a simplified cross section of a gas ring that may be used in conjunction with the exemplary processing system of FIG. 4A.

The present invention deposits low compressive stress STI films with good gap fill characteristics. The method may be understood with reference to FIGS. 2 and 3, however it is not so limited. FIGS. 2 and 3 depict embodiments of the method of the present invention and an STI film so deposited. FIGS. 4A and 4B represent portions of a device useful for depositing STI films according to the embodiments of FIGS. 2 and 3, respectively. As previously stated, embodiments of the present invention can be practiced in an HDP-CVD chamber such as exemplary chamber described below with reference to FIGS. 4A and 4B. The process is for exemplary purposes only and is not intended to limit the scope of the claims of the present invention. Where applicable, reference numbers in the description below are used to refer to appropriate components of the exemplary system 410 and chamber 413 of FIGS. 4A–4B.

The first embodiment of the method is best understood by referring to FIGS. 2 and 3. FIG. 2 depicts a flow diagram for depositing an low compressive stress STI film 312. Method 200 begins at step 202, where the substrate 301 upon which the STI film 312 is to be deposited according to the present invention is transferred into deposition chamber 413. Next, a flow of an oxidizer is introduced into the chamber and a plasma is formed (step 204). The plasma is used to heat the substrate before actual film deposition starts (step 206). Typically this heating step uses no bias RF power in order to ensure the underlying substrate features are not sputtered. The substrate is typically heated to a temperature between about 200–450° C. during step 206, but can be used to heat the substrate even further. In some embodiments, the substrate is heated by a plasma of an oxidizer and/or helium, argon or a similar inert gas.

Next, flows of a silicon-containing source, such as a silane gas, and a stress-lowering dopant source are introduced into the deposition chamber to initiate deposition of the STI film 312, and the RF bias power is turned ON (step 208). The length of the deposition process in step 208 is determined by the desired thickness of the STI film 312. In some embodiments, the flow of the fluent gas (if used) is also stopped during step 206. In these embodiments, it is generally desirable, however, to maintain a flow of at least one common gas (e.g., the oxidizer) from step 204 to step 208 in order to improve plasma uniformity and/or prevent the plasma from being extinguished during the switch in gases introduced into the chamber. A source gas reflow process may be included at optional step 208a if desired, particularly if an STI film with a higher dopant concentration is desired. Such a reflow process may be useful to achieve better gap fill and film stability.

The specific order of the blocks shown in FIG. 2 is not intended to be restrictive and in other embodiments, additional steps may be performed. For instance, with reference to FIG. 2, the gases from steps 204 and 208 may be added at the same time, or in separate steps as indicated. The substrate may also be heated during step 208, or prior to step 208 at step 206 as indicated.

The flow rate of the stress-lowering dopant source during step 208 (as well as reflow rate at optional step 208a) and deposition conditions are optimized as described in more detail below to achieve the best results for any desired compressive stress and gap fill situation. In some embodiments, the flow rate of the stress-lowering dopant source and deposition conditions are such that the atomic weight percentage of dopant incorporated into the STI film is sufficient to lower the compressive stress of the STI film to less than at least 180 MPa, preferably less than about 170 MPa, more preferably less than about 150 MPa, even more preferably less than about 100 MPa, and even more preferably less than about 90 MPa. By way of example, the atomic weight percentage of the stress-lowering dopant in the STI film may range from about 0.1 at. % to about 25 at. %, 0.2 at. % to about 25 at. %, 0.5 at. % to about 25 at. %; preferably from about 0.1 at. % to about 10 at. %, 0.2 at. % to about 10 at. %, 0.5 at. % to about 10 at. %; and more preferably from about 0.1 at. % to about 5 at. %, 0.2 at. % to about 5 at. %, 0.5 at. % to about 5 at. %.

Furthermore, in some embodiments the ratio of the flow rate of the oxygen-source to the silicon source is between about 1.2 and 3.0 to 1.0. Without intending to be limited by theory, at ratios below about 1.2:1.0 the silicon oxide film becomes silicon rich, and may exhibit poor electrical breakdown characteristics as well as undesirably high refractive index. At ratios above about 3.0:1.0, the relatively high gas flow rates required to achieve such ratios may increase the chamber pressure to undesirably high levels, which in turn degrades film gap-fill capabilities.

In certain embodiments, the silicon source may be any suitable silicon source such as a $Si_xH_y$ gas or liquid source compound, or combinations thereof, wherein x has a range of 1 to 2, y has a range of 4 to 6, e.g., silane ($SiH_4$). Further, any suitable fluent source gas, e.g., $H_2$, Ar, He, Ne, etc,. and oxidizer, e.g., $O_2$, $N_2O$, CO, $CO_2$, etc., known in the art may be used.

The stress-lowering dopant source may be any suitable dopant capable of lowering the compressive stress of a deposited STI film, such as a fluorine containing source, a germanium containing source, or a phosphorous containing source.

The fluorine containing source may be any suitable fluorine source gas, such as carbon tetrafluoride ($CF_4$), fluoroethane ($C_2F_6$), trifluoromethane ($CHF_3$), difluoromethane ($CH_2F_2$), silicon tetrafluoride ($SiF_4$), nitrogen fluoride ($NF_3$), and combinations thereof. In certain embodiments, the fluorine containing source gas may be provided in the source gas mixture at step 208 at a fluorine-containing source: silicon source ratio is in a range of about 1.0:4.0 to about 3.0:2.0. In another embodiment, $\mathcal{F}$(fluorine-containing source gas)/$\mathcal{F}$ (silicon containing source gas+fluorine containing source gas) in the gas mixture ranges from about 0.29 to about 0.60.

The germanium containing source may be any suitable germanium source gas, such as germanium tetrahydride ($GeH_4$), germanium halide (e.g., $GeF_4$). In certain embodiments, the germanium containing source gas may be provided in the source gas mixture at step 208 at a germanium-containing source: silicon source ratio in a range of about 1.0:1.0 to about 1.0:4.0. In another embodiment, $\mathcal{F}$(germanium-containing source gas)/$\mathcal{F}$ (silicon containing source gas+germanium containing source gas) in the gas mixture ranges from about 0.25 to about 0.50.

The phosphorous containing source may be any suitable phosphorous source gas, such as phosphine ($PH_3$). In certain embodiments, the phosphorous containing source gas may be provided in the source gas mixture at step 208 at a phosphorous-containing source: silicon source ratio in a range of about 1.0:2.0 and 1.0:5.0. In another embodiment, $\mathcal{F}$(phosphorous-containing source gas)/$\mathcal{F}$ (silicon containing source gas+phosphorous containing source gas) in the gas mixture ranges from about 0.26 to about 0.48.

Table 1 below lists exemplary ranges for the primary deposition parameters in steps 204–208, except for deposition temperature, according to one embodiment of the present invention. In Table 1 below, TVO means "throttle valve fully open" which results in chamber pressure being controlled by the quantity of gas flowed into the chamber.

| | |
|---|---|
| Silicon Source | about 10 sccm to about 200 sccm |
| Stress-Lowering Dopant Source | about 3 sccm to about 300 sccm |
| Fluent Source(s) | 0 sccm to about 1000 sccm |
| Oxidizer Source | about 30 sccm to about 900 sccm |
| Pressure | 1–4 mTorr to 100 mTorr to (TVO) |
| Side RF Power for a 300 mm wafer | 4500–9000 Watts (more aggressive gap-fill); 1000–4500 Watts (less aggressive gap-fill) |
| Top RF Power for a 300 mm wafer | 4500–9000 Watts (more aggressive gap-fill); 1800–4500 Watts (less aggressive gap-fill) |
| Bias RF Power for a 300 mm wafer | 1000–8000 Watts |

In certain embodiments, the substrate may be continuously heated by the plasma during deposition step 208 to temperatures ranging from 450° C. to about 700° C., preferably ranging from about 500° C. to about 700° C. In other embodiments, no temperature control is used during deposition of the layer in step 208. Instead, the substrate is allowed to be heated to as high a temperature as possible by the plasma. Generally in these embodiments the substrate temperature reaches between 650° C. and 750° C.

With reference to FIG. 3, the initial substrate structure 301 is shown schematically as including features 300 that are to be filled with a dielectric material. The process conditions for the deposition result in the formation of a deposited layer 310 so that the basic shape of the original features 300 are retained, but are less severe. When the final aspects of the deposition are performed, the features 300 may be filled completely with STI film 312, such as shown schematically with structure 304.

III. Exemplary Substrate Processing System

FIGS. 4A and 4B illustrate one embodiment of a high density plasma chemical vapor deposition (HDP-CVD) system 10 in which a dielectric layer according to the present invention can be deposited. FIG. 4A schematically illustrates the structure of such an HDP-CVD system 410 in one embodiment. The system 410 includes a chamber 413, a vacuum system 470, a source plasma system 480A, a bias plasma system 480B, a gas delivery system 433, and a remote plasma cleaning system 450.

The upper portion of chamber 413 includes a dome 414, which is made of a ceramic dielectric material, such as aluminum oxide or aluminum nitride. Dome 414 defines an upper boundary of a plasma processing region 416. Plasma processing region 416 is bounded on the bottom by the upper surface of a substrate 417 and a substrate support member 418.

A heater plate 423 and a cold plate 424 surmount, and are thermally coupled to, dome 414. Heater plate 423 and cold plate 424 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 413 includes a body member 422, which joins the chamber to the vacuum system. A base portion 421 of substrate support member 418 is mounted on, and forms a continuous inner surface with, body member 422. Substrates are transferred into and out of chamber 413 by a robot blade (not shown) through an insertion/removal opening (not shown) in the side of chamber 413. Lift pins (not shown) are raised and then lowered under the control of a motor (also not shown) to move the substrate from the robot blade at an upper loading position 457 to a lower processing position 456 in which the substrate is placed on a substrate receiving portion 419 of substrate support member 418. Substrate receiving portion 419 includes an electrostatic chuck 420 that secures the substrate to substrate support member 418 during substrate processing. In a preferred embodiment, substrate support member 418 is made from an aluminum oxide or aluminum ceramic material.

Vacuum system 470 includes throttle body 425, which houses twin-blade throttle valve 426 and is attached to gate valve 427 and turbo-molecular pump 428. It should be noted that throttle body 425 offers minimum obstruction to gas flow, and allows symmetric pumping. Gate valve 427 can isolate pump 428 from throttle body 425, and can also control chamber pressure by restricting the exhaust flow capacity when throttle valve 426 is fully open. The arrangement of the throttle valve, gate valve, and turbo-molecular pump allow accurate and stable control of chamber pressures up to about 1 millitorr to about 2 torr.

The source plasma system 480A includes a top coil 429 and side coil 430, mounted on dome 414. A symmetrical ground shield (not shown) reduces electrical coupling between the coils. Top coil 429 is powered by top source RF (SRF) generator 431A, whereas side coil 430 is powered by side SRF generator 431B, allowing independent power levels and frequencies of operation for each coil. This dual coil system allows control of the radial ion density in chamber 413, thereby improving plasma uniformity. Side coil 430 and top coil 429 are typically inductively driven, which does not require a complimentary electrode. In a specific embodiment, the top source RF generator 431A provides up to 2,500 watts of RF power at nominally 2 MHz and the side source RF generator 431B provides up to 9,000 watts of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

A bias plasma system 480B includes a bias RF ("BRF") generator 431C and a bias matching network 432C. The bias plasma system 480B capacitively couples substrate portion 417 to body member 422, which act as complimentary electrodes. The bias plasma system 480B serves to enhance the transport of plasma species (e.g., ions) created by the source plasma system 480A to the surface of the substrate. In a specific embodiment, bias RF generator provides up to 8,000 watts of RF power at a frequency less than 5 MHz, as discussed further herein.

RF generators 431A and 431B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 432A and 432B match the output impedance of generators 431A and 431B with their respective coils 429 and 430. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 433 provides gases from several sources, 434A–434E chamber for processing the substrate via gas delivery lines 438 (only some of which are shown). As would be understood by a person of skill in the art, the actual sources used for sources 434A–434E and the actual connection of delivery lines 438 to chamber 413 varies depending on the deposition and cleaning processes executed within chamber 413. Gases are introduced into chamber 413 through a gas ring 437 and/or a top nozzle 445. FIG. 4B is a simplified, partial cross-sectional view of chamber 413 showing additional details of gas ring 437.

In one embodiment, first and second gas sources, 434A and 434B, and first and second gas flow controllers, 435A' and 435B', provide gas to ring plenum 436 in gas ring 437 via gas delivery lines 438 (only some of which are shown). Gas ring 437 has a plurality of source gas nozzles 439 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 437 has 12 source gas nozzles made from an aluminum oxide ceramic.

Gas ring 437 also has a plurality of oxidizer gas nozzles 440 (only one of which is shown), which in a preferred embodiment are co-planar with and shorter than source gas nozzles 439, and in one embodiment receive gas from body plenum 441. In some embodiments it is desirable not to mix source gases and oxidizer gases before injecting the gases into chamber 413. In other embodiments, oxidizer gas and source gas may be mixed prior to injecting the gases into chamber 413 by providing apertures (not shown) between body plenum 441 and gas ring plenum 436. In one embodiment, third, fourth, and fifth gas sources, 434C, 434D, and 434D', and third and fourth gas flow controllers, 435C and 435D', provide gas to body plenum via gas delivery lines 438. Additional valves, such as 443B (other valves not shown), may shut off gas from the flow controllers to the chamber. In implementing certain embodiments of the invention, source 434A comprises a fluorinated silicon source, source 434B comprises a molecular oxygen $O_2$ source, source 434C comprises a fluorine source, source 434D comprises a helium He source, and source 434D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 443B, to isolate chamber 413 from delivery line 438A and to vent delivery line 438A to vacuum foreline 444, for example. As shown in FIG. 4A, other similar valves, such as 443A and 443C, may be incorporated on other gas delivery lines. Such three-way valves may be placed as close to chamber 413 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 4A, chamber 413 also has top nozzle 445 and top vent 446. Top nozzle 445 and top vent 446 allow independent control of top and side flows of the gases, which improves film uniformity and allows fine adjustment of the film's deposition and doping parameters. Top vent 446 is an annular opening around top nozzle 445. In one embodiment, first gas source 434A supplies source gas nozzles 439 and top nozzle 445. Source nozzle MFC 435A' controls the amount of gas delivered to source gas nozzles 439 and top nozzle MFC 435A controls the amount of gas delivered to top gas nozzle 445. Similarly, two MFCs 435B and 435B' may be used to control the flow of oxygen to both top vent 446 and oxidizer gas nozzles 440 from a single source of oxygen, such as source 434B. In some embodiments, oxygen is not supplied to the chamber from any side nozzles. The gases supplied to top nozzle 445 and top vent 446 may be kept separate prior to flowing the gases into chamber 413, or the gases may be mixed in top plenum 448 before they flow into chamber 413. Separate sources of the same gas may be used to supply various portions of the chamber.

A remote microwave-generated plasma cleaning system 450 is provided to periodically clean deposition residues from chamber components. The cleaning system includes a remote microwave generator 451 that creates a plasma from a cleaning gas source 434E (e.g., molecular fluorine, nitrogen trifluoride, other fluorocarbons or equivalents) in reactor cavity 453. The reactive species resulting from this plasma are conveyed to chamber 413 through cleaning gas feed port 454 via applicator tube 455. The materials used to contain the cleaning plasma (e.g., cavity 453 and applicator tube 455) must be resistant to attack by the plasma. The distance between reactor cavity 453 and feed port 454 should be kept as short as practical, since the concentration of desirable plasma species may decline with distance from reactor cavity 453. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 420, do not need to be covered with a dummy wafer or otherwise protected, as may be required with an in situ plasma cleaning process. In FIG. 4A, the plasma-cleaning system 450 is shown disposed above the chamber 413, although other positions may alternatively be used.

A baffle 461 may be provided proximate the top nozzle to direct flows of source gases supplied through the top nozzle into the chamber and to direct flows of remotely generated plasma. Source gases provided through top nozzle 445 are directed through a central passage 462 into the chamber, while remotely generated plasma species provided through the cleaning gas feed port 454 are directed to the sides of the chamber 413 by the baffle 461.

about 30 sccm to about 200 sccm, a flow rate of $NF_3$ ranging from 20 sccm to about 300 sccm, a flow rate of $GeH_4$ ranging from 40 sccm to about 200 sccm, a flow rate for $PH_3$ ranging from 8 sccm to about 100 sccm, a flow rate for $H_2$ ranging from 0 sccm to about 1000 sccm, a flow rate for $O_2$ ranging from about 90 sccm to about 900 sccm, and a flow rate of fluent ranging from 150 sccm to about 800 sccm were used. The tables below show representative flow rates, RF powers, and STI film property ranges for certain preferred embodiments of the invention.

Fluorine doped low stress STI

| | $SiH_4$ | $NF_3$ | $O_2$ | $H_2$ | BRF | SRF | $NF_3/(SiH_4 + NF_3)$ | F % | Stress |
|---|---|---|---|---|---|---|---|---|---|
| High | 200 | 300 | 400 | 1000 | 8000 w | 9 kw/9 kw | 0.60 | ~4.0 | ~70 MPa |
| Low | 50 | 20 | 105 | 300 | 3000 w | 7 kw/6 kw | 0.29 | ~0.1 | ~170 MPa |

Ge doped low stress STI

| | $SiH_4$ | $GeH_4$ | $O_2$ | He | BRF | SRF | $GeH_4/(SiH_4 + GeH_4)$ | Stress |
|---|---|---|---|---|---|---|---|---|
| High | 200 | 200 | 900 | 800 | 8000 w | 9 kw/9 kw | 0.50 | ~30 MPa |
| Low | 120 | 40 | 225 | 150 | 3500 | 3 kw/2 kw | 0.25 | ~90 MPa |

P doped low stress STI

| | $SiH_4$ | $PH_3$ | $O_2$ | He | $H_2$ | BRF | SRF | $PH_3/SiH_4$ | P % | Stress |
|---|---|---|---|---|---|---|---|---|---|---|
| High | 200 | 100 | 800 | 800 | 1000 | 8000 w | 9 kw/9 kw | 0.48 | ~10% | ~50 MPa |
| Low | 30 | 8 | 90 | 350 | 0 | 2500 w | 5 kw/7 kw | 0.26 | ~5% | ~77 MPa |

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the commonly assigned U.S. Pat. No. 6,170,428, entitled "Symmetric Tunable Inductively-Coupled HDP-CVD Reactor," the disclosure of which is incorporated herein by reference. The described system is for exemplary purpose only. It would be a matter of routine skill for a person of skill in the art to select an appropriate conventional substrate processing system and computer control system to implement the present invention.

IV. Experimental Results

Experimental results have demonstrated that it is possible to achieve low compressive stress STI films in accordance with the methods of the present invention. Furthermore, the low compressive stress STI films described herein exhibit good gap fill characteristics.

In testing performed, process parameters including RF powers, gas flows and gas ratios were varied to arrive at a desired film. To select a film having the desired properties, design of experiments (DOEs) for the low compressive stress STI films were performed. As noted below, in certain embodiments (if present) a flow rate for $SiH_4$ ranging from Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a low compressive stress, shallow trench isolation (STI) film with good gap fill characteristics on a substrate, said method comprising:
    (a) positioning a substrate in a deposition chamber, wherein said substrate comprises at least one isolation trench between adjacent raised surfaces formed by anisotropic etching;
    (b) providing a gas mixture to the deposition chamber in one or more steps, wherein the gas mixture comprises a silicon source gas, a stress-lowering dopant source gas, at least one fluent source gas, and an oxidizer;
    (c) reacting the gas mixture in the presence of an electric field to generate a plasma having an ion density of at least $10^{11}$ ions/cm$^3$;

(d) and exposing said substrate to said plasma at a temperature greater than about 450° C. under conditions sufficient to thereby deposit a low compressive stress STI film within said isolation trench;

wherein said STI film exhibits a compressive stress of less than about 170 MPa.

2. The method of claim 1, wherein said substrate farther comprises a pad oxide and a pad nitride at predetermined locations thereon, and said at least one isolation trench comprises a liner oxide formed on the wall thereof to thereby improve gap-fill and adhesion properties of said deposited STI film.

3. The method of claim 1, wherein the silicon source gas is silane (SiH4).

4. The method of claim 1, wherein the stress-lowering dopant source gas is selected from the group consisting of: a fluorine containing source gas, a germanium containing source gas, and a phosphorous containing source gas.

5. The method of claim 4, wherein the fluorine containing source gas is selected from the group consisting of: carbon tetrafluoride ($CF_4$), fluoroethane ($C_2F_6$), trifluoromethane ($CHF_3$), difluoromethane ($CH_2F_2$), silicon tetrafluoride ($SiF_4$), nitrogen trifluoride ($NF_3$), and combinations thereof.

6. The method of claim 4, wherein the germanium containing source gas is selected from the group consisting of: germanium tetrahydride ($GeH_4$) and germanium halides.

7. The method of claim 4, wherein the phosphorous containing source gas is phosphine ($PH_3$).

8. The method of claim 1, wherein said at least one fluent source gas comprises a hydrogen-source gas.

9. The method of claim 1, wherein said at least one fluent source gas is selected from the group consisting of hydrogen ($H_2$), helium (He), argon (Ar), neon (Ne), and combinations thereof.

10. The method of claim 1, wherein the at least one fluent source gas is provided to the deposition chamber at a flow rate in a range of about 0 sccm to about 1000 sccm.

11. The method of claim 1, wherein the stress-lowering dopant source gas is a fluorine-containing source gas.

12. The method of claim 11, wherein the fluorine-containing source gas: silicon source gas ratio in the gas mixture is in a range of about 1.0:4.0 to about 3.0:2.0.

13. The method of claim 11, wherein $\mathcal{F}$(fluorine-containing source gas)/$\mathcal{F}$ (silicon containing source gas+fluorine containing source gas) in the gas mixture ranges from about 0.29 to about 0.60.

14. The method of claim 11, wherein the STI film exhibits a compressive stress less than about 100 MPa.

15. The method of claim 11, wherein the STI film exhibits a compressive stress less than about 90 MPa.

16. The method of claim 1, wherein the stress-lowering dopant source gas is a germanium-containing source gas.

17. The method of claim 16, wherein the germanium-containing source gas : silicon source gas ratio in the gas mixture is in a range of about 1.0:1.0 to about 1.0:4.0.

18. The method of claim 16, wherein $\mathcal{F}$(germanium-containing source gas)/$\mathcal{F}$ (silicon containing source gas+germanium containing source gas) in the gas mixture ranges from about 0.25 to about 0.50.

19. The method of claim 16, wherein the STI film exhibits a compressive stress less than about 100 MPa.

20. The method of claim 1, wherein the stress-lowering dopant source gas is a phosphorous-containing source gas.

21. The method of claim 20, wherein the phosphorous-containing source gas: silicon source gas ratio in the gas mixture is in a range of about 1.0:2.0 and 1.0:5.0.

22. The method of claim 20, wherein $\mathcal{F}$(phosphorous-containing source gas)/$\mathcal{F}$ (silicon containing source gas+ phosphorous containing source gas) in the gas mixture ranges from about 0.26 to about 0.48.

23. The method of claim 20, wherein the STI film exhibits a compressive stress less than about 100 MPa.

24. The method of claim 1, wherein the silicon source gas is provided to the deposition chamber at a flow rate in a range of about 10 sccm to about 200 sccm.

25. The method of claim 1, wherein the stress-lowering dopant source gas is provided to the deposition chamber at a flow rate in a range of about 3 sccm to about 300 sccm.

26. The method of claim 1, wherein the oxidizer is provided to the deposition chamber at a flow rate in a range of about 30 sccm to about 900 sccm.

27. The method of claim 1, wherein the electric field is generated from one or more radio frequency (RF) powers within a range of about 1000 W to about 9 kW for a 300 mm wafer.

28. The method of claim 1, wherein the STI film exhibits a compressive stress less than about 100 MPa.

29. The method of claim 1, wherein said low compressive stress STI film comprises between about 0.1 and 25 at. % of said stress-lowering dopant.

30. A method of lowering the compressing stress of a shallow trench isolation (STI) film, said method comprising:

(a) providing a gas mixture comprising a silicon source gas, a stress-lowering dopant source gas, at least one fluent source gas, and an oxidizer to a high density plasma chemical vapor deposition (HDP-CVD) chamber for deposition of a low compressive stress STI film on a substrate comprising at least one isolation trench via high density plasma chemical vapor deposition (HDP-CVD); and (b) generating a plasma within said HDP-CVD chamber to thereby deposit said low compressive stress STI film within said at least one isolation trench on said substrate;

wherein said substrate is heated to a temperature greater than 450° C. during said deposition;

wherein said gas mixture comprises sufficient stress-lowering dopant source and said STI film is deposited under conditions sufficient to result in the deposit of a STI film that exhibits a compressive stress of less than about 170 MPa.

* * * * *